(12) United States Patent
Walker et al.

(10) Patent No.: US 11,302,697 B2
(45) Date of Patent: Apr. 12, 2022

(54) DRAM WITH SELECTIVE EPITAXIAL CELL TRANSISTOR

(71) Applicant: Integrated Silicon Solution, (Cayman) Inc., Grand Cayman (KY)

(72) Inventors: Andrew J. Walker, Mountain View, CA (US); Dafna Beery, Palo Alto, CA (US); Peter Cuevas, Los Gatos, CA (US); Amitay Levi, Cupertino, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/774,928

(22) Filed: Jan. 28, 2020

(65) Prior Publication Data

US 2021/0233913 A1 Jul. 29, 2021

(51) Int. Cl.
*H01L 21/00* (2006.01)
*H01L 27/108* (2006.01)
*H01L 29/06* (2006.01)
*H01L 29/66* (2006.01)
*H01L 29/161* (2006.01)
(Continued)

(52) U.S. Cl.
CPC .. *H01L 27/10808* (2013.01); *H01L 27/10855* (2013.01); *H01L 27/10873* (2013.01); *H01L 27/10891* (2013.01); *H01L 29/0649* (2013.01); *H01L 29/16* (2013.01); *H01L 29/161* (2013.01); *H01L 29/20* (2013.01); *H01L 29/66522* (2013.01); *H01L 29/66666* (2013.01); *H01L 29/7827* (2013.01)

(58) Field of Classification Search
CPC ......... H01L 27/10808; H01L 27/10855; H01L 27/10873; H01L 27/10891; H01L 29/0649; H01L 29/16; H01L 29/161; H01L 29/20; H01L 29/66522; H01L 29/66666; H01L 29/7827
See application file for complete search history.

(56) References Cited

U.S. PATENT DOCUMENTS 3,387,286 A 6/1968 Dennard
5,382,540 A 1/1995 Sharma et al.
(Continued)

OTHER PUBLICATIONS

Prall et al., "Benchmarking and Metrics for Emerging Memories," IEEE, 2017, 5 pages.
(Continued)

*Primary Examiner* — Richard A Booth

(57) ABSTRACT

A dynamic random access memory element that includes a vertical semiconductor transistor element formed on a substrate and electrically connected with a memory element such as a capacitive memory element. The memory element is located above the semiconductor substrate such that the vertical transistor is between the memory element and the substrate. The vertical semiconductor transistor is formed on a heavily doped region of the substrate that is separated from other portions of the substrate by a dielectric isolation layer. The heavily doped region of the semiconductor substrate provides electrical connection between the vertical transistor structure and a bit line. The dynamic random access memory element also includes a word line that includes an electrically conductive gate layer that is separated from the semiconductor pillar by a gate dielectric layer.

15 Claims, 18 Drawing Sheets

(51) Int. Cl.
  *H01L 29/20* (2006.01)
  *H01L 29/78* (2006.01)
  *H01L 29/16* (2006.01)

(56) References Cited

U.S. PATENT DOCUMENTS

| | | | |
|---|---|---|---|
| 5,958,505 | A | 9/1999 | Manti |
| 9,472,542 | B2 | 10/2016 | Mueller et al. |
| 9,691,773 | B2* | 6/2017 | Surthi ................. H01L 23/5222 |
| 10,269,805 | B2* | 4/2019 | Pandey ............. H01L 27/10814 |
| 10,886,330 | B2* | 1/2021 | Pinarbasi ................. H01L 43/12 |
| 10,916,696 | B2* | 2/2021 | Pinarbasi ................. H01L 43/12 |
| 2007/0277875 | A1 | 12/2007 | Gadkaree et al. |
| 2009/0084308 | A1 | 4/2009 | Kishi et al. |
| 2013/0146958 | A1* | 6/2013 | Kim ................. H01L 21/32053 257/302 |

OTHER PUBLICATIONS

Lee et al. "A Proposal on an Optimized Device Structure With Experimental Studies on Recent Devices for the DRAM Cell Transistor," IEEE Transactions on Electron Devices, vol. 54, No. 12, Dec. 2007, pp. 3325-3335.

Kim et al., "A New Investigation of Data Retention Time in Truly Nanoscaled DRAMs," IEEE Electron Device Letters, vol. 30, No. 8, Aug. 2009, pp. 846-848.

Yang et al., "Trap-Assisted DRAM Row Hammer Effect," IEEE Electron Device Letters, vol. 40, No. 3, Mar. 2019, pp. 391-394.

Gautam et al., "Row Hammering Mitigation Using Metal Nanowire in Saddle Fin DRAM," IEEE Transactions on Electron Devices, vol. 66, No. 10, Oct. 2019, pp. 4170-4175.

Sunami, H., "Cell Structures for Future Dram's," IEEE, IEDM, 1985, pp. 694-697.

Han et al., "Soft Error in Saddle Fin Based DRAM," IEEE Electron Device Letters, vol. 40, No. 4, Apr. 2019, pp. 494-497.

Reader et al., "Transition metal silicides in silicon technology," Reports on Progress in Physics, vol. 56, 1992, pp. 1397-1467.

Walker et al., U.S. Appl. No. 16/828,879, filed Mar. 24, 2020.

Mantl, S., "Molecular beam allotaxy: a new approach to epitaxial heterostructures," Journal of Physics D: Applied Physics, vol. 31, 1998, pp. 1-17.

Non-Final Office Action from U.S. Appl. No. 16/828,879, dated Jun. 15, 2021.

Deleonibus, S., "Marvels of Microelectronic Technology: The 1T-1C Dynamic Random Access Memory, From a Groundbreaking Idea to a Business Benchmark," IEEE Electron Devices Society Newsletter, vol. 26, No. 4, Oct. 2019, pp. 1-9.

TechInsights, "Technology Roadmap of DRAM for Three Major Manufacturers: Samsung, SK-Hynix and Micron," TechInsights, Oct. 2014, 22 pages.

Kim et al., "Flipping Bits in Memory Without Accessing Them: An Experimental Study of DRAM Disturbance Errors," IEEE, 2014, pp. 1-12.

Mutlu, O., "The Row Hammer Problem and Other Issues We May Face as Memory Becomes Denser," 2017, pp. 1-6, retrieved from https://people.inf.ethz.ch/omutlu/pub/rowhammer-and-other-memory-issues_date17.pdf.

Udrea et al., "The MOS Inversion Layer as a Minority Carrier Injector," IEEE Electron Device Letters, vol. 17, No. 9, Sep. 1996, pp. 425-427.

* cited by examiner

DRAM WITH SELECTIVE EPITAXIAL CELL TRANSISTOR

FIELD OF THE INVENTION

The present invention relates Dynamic Random Access memory (DRAM) and more particularly to a DRAM device incorporating an epitaxially grown vertical semiconductor transistor.

BACKGROUND

Dynamic Random Access Memory (DRAM) is a type of memory storage that can be utilized for storing information in programmable systems. DRAM may be fabricated as an array comprising individual memory cells containing a transistor in combination with a charge-storage device (such as, for example, a capacitor). Bitlines and wordlines may extend across the array, and may be utilized for accessing individual memory cells.

A continuing goal is to increase integration, and accordingly to increase packing density of the DRAM system. A problem encountered as DRAM is packed to higher density is that crosstalk between adjacent word-lines (sometimes referred to as Row-Hammer) becomes problematic. There is a need, therefore, for an architecture that can provide high density, while also avoiding undesirable issues such as cross-talk between lines.

SUMMARY

The present invention provides a dynamic random access memory device that includes a semiconductor substrate having a doped diffusion region formed therein and a a vertical transistor structure formed on a surface of the doped diffusion region of the semiconductor substrate. The transistor structure includes a semiconductor pillar and a gate dielectric layer formed at a side of the semiconductor pillar. The device also includes an electrically conductive gate layer that contacts the gate dielectric layer and a bit line that is electrically connected with the doped diffusion region. A memory element is electrically connected with an end of the semiconductor pillar.

The memory element can be a capacitive memory element that can be located above the semiconductor substrate such that the semiconductor transistor is between the semiconductor substrate and the memory element.

Constructing the dynamic random access memory device with a vertical transistor formed on the substrate rather than buried within the substrate advantageously avoids Row Hammer, improves radiation hardness and increases refresh time, and also allows for greatly increased memory density.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Dynamic Random-Access Memory (DRAM) is a promising solid memory technology with a continuous scaling path that has evolved from minimum feature sizes of several microns to advanced structures of today with minimum feature sizes of just less than 20 nm. However, various disturb mechanisms and structural and manufacturing challenges are hindering further scaling of DRAM systems.

Figure 1:
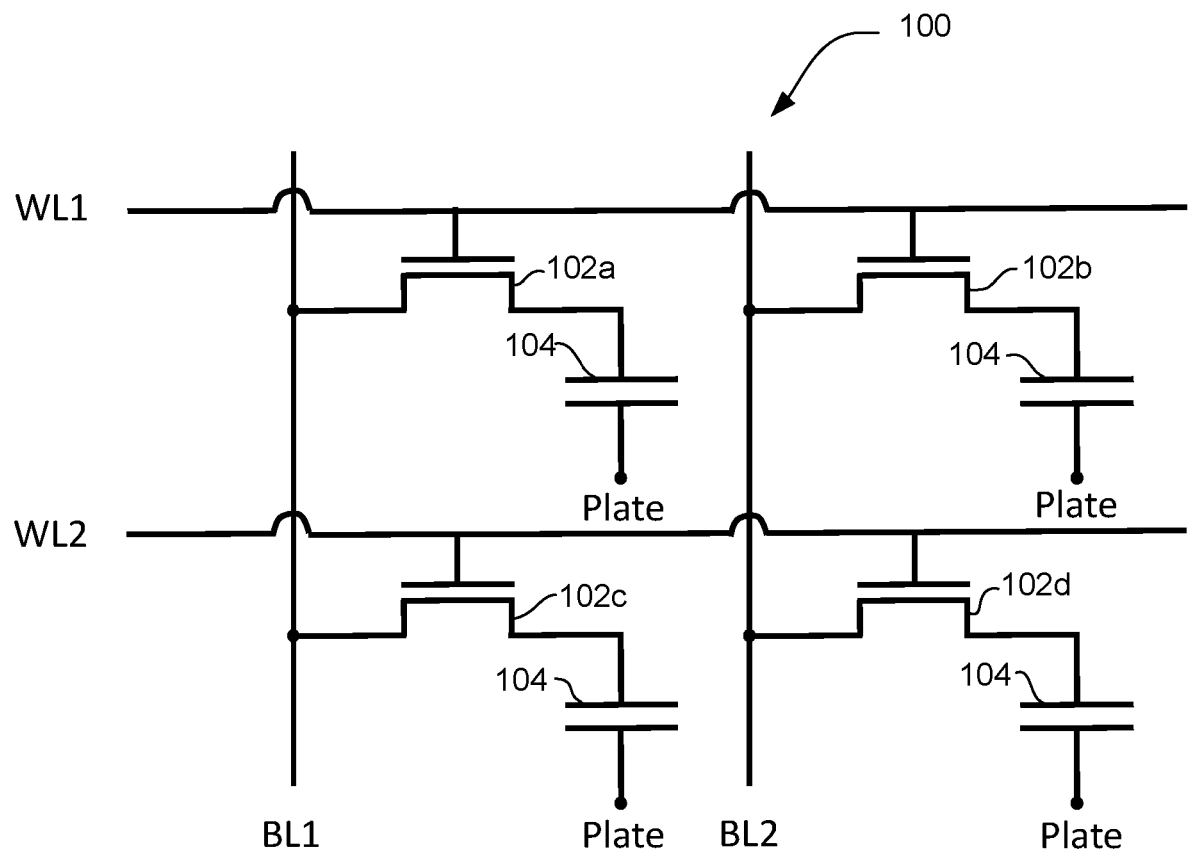
FIG. 1 is an electrical schematic of a DRAM array.

FIG. 1 shows a schematic illustration of a DRAM system 100. The DRAM system 100 includes rows of wordlines W1, W2, etc. and columns of bitlines BL1, BL2, etc. The wordlines W1, W2 are connected with gates of transistors 102. The bitlines BL1, BL2 are connected with source regions of transistors 102. The drains of the transistors 102 are connected with an assigned memory storage element 104. The memory storage element can be a capacitor as shown in FIG. 1, although the memory storage element could be some other type of device capable of recording a memory state when a voltage or current is applied. When a voltage is applied to the gate of a transistor 102 by a wordline WL, the transistor 102 is opened and a voltage can be applied to the memory element 102 by the bitline BL to either write or read a data bit to or from the associated memory storage element 104.

DRAM systems have been formed within a semiconductor substrate using semiconductor fabricating processes familiar to those skilled in the art. As a result, further scaling of such DRAM systems are reaching a practical limit. This is because of various structural limitations such as required lateral spacing and various disturb mechanisms inherent in such designs.

Figure 2:
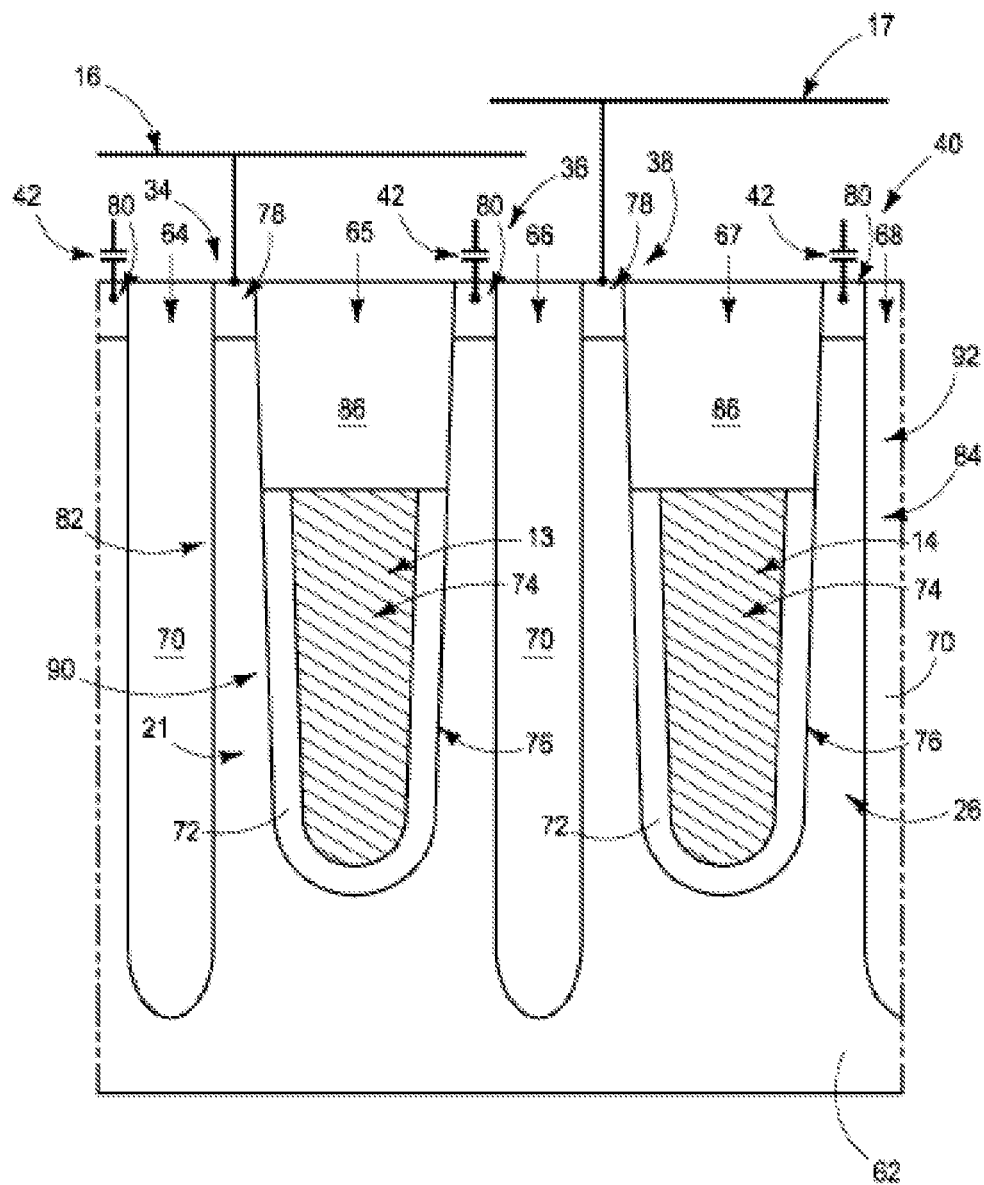
FIG. 2 is a cross-sectional view of a prior art DRAM memory cell.

FIG. 2 illustrates an example of such a prior art DRAM structure. Referring to FIG. 2, a DRAM array 60 is shown in cross-sectional side view. The DRAM array 60 comprises a base material 62. Such base material may be a semiconductor material, and in some embodiments may comprise, consist essentially of, or consist of monocrystalline silicon. In some embodiments, base material 62 may comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base material 62 may comprise a semiconductor substrate containing one or more materials associated with integrated circuit fabrication. Some of the materials may be under the shown region of base material 62 and/or may be laterally adjacent to the shown region of base material 62; and may correspond to, for example, one or more of refractory metal materials, barrier materials, diffusion materials, insulator materials, etc.

Trenches 64-68 extend into base material 62. Such trenches are configured in a pattern of alternating deep trenches (64, 66 and 68) and shallow trenches (65 and 67).

Electrically insulative material 70 is within the deep trenches (64, 66 and 68), and in the shown embodiment completely fills the deep trenches. Such electrically insulative material may comprise any suitable composition or combination of compositions; and in some embodiments may comprise, consist essentially of, or consist of one or both of silicon dioxide and silicon nitride. In the shown embodiment, material 70 is the only material within the deep trenches. The electrically insulative material 70 within the deep trenches may be sufficient by itself to prevent crosstalk between adjacent wordlines (e.g., may be sufficient to prevent the row-hammer problem of conventional DRAM array architectures). This is in contrast to some prior art DRAM configurations in which electrically biased conductive materials are provided between adjacent memory cells to enhance electrical isolation of memory cells.

The wordlines 13 and 14 are within shallow trenches 65 and 67, respectively. Such wordlines may be considered to be examples of electrically conductive lines that may be formed within the shallow trenches.

The wordlines are spaced from semiconductor material of base 62 by gate dielectric material 72. The gate dielectric material may comprise any suitable composition or combination of compositions; and in some embodiments may comprise, consist essentially of, or consist of silicon dioxide. The illustrated regions of the wordlines along the cross-section of FIG. 2 correspond to transistor gates 74.

The cell active areas 21 and 26 are shown to be trough-shaped (specifically, U-shaped in the shown embodiment), and to correspond to transistor active areas. Such transistor active areas comprise channel regions 76 adjacent the transistor gates, and comprise source/drain regions 78 and 80 at upper regions of the trough-shapes. The source/drain regions may be conductively-doped regions of semiconductor material of base 62. For instance, the source/drain regions may be n-type doped regions or p-type doped regions within a silicon-containing base 62 in some embodiments.

The channel region 76 may also be a doped region within semiconductor material of base 62, and specifically may be doped to obtain a desired threshold voltage.

The transistor gates 74, channel regions 76 and source/drain regions 78/80 together form a pair of transistors 82 and 84. The transistors 82 and 84 are illustrated relative to the cell active material structures 21 and 26, respectively. Similar transistors are at all of the other cell active material structures 20, 22-25 and 27-31 of FIG. 1, and accordingly the transistors 82 and 84 are representative of a plurality of transistors present within an example embodiment DRAM array. In some embodiments, the transistor gates 74, channel regions 76 and source/drain regions 78/80 may be considered as together comprising such plurality of transistors.

In the shown embodiment, electrically insulative material 86 is formed over wordlines 13 and 14 within the shallow trenches 65 and 67. Such electrically insulative material may comprise any suitable composition or combination of compositions; and in some embodiments may comprise, consist essentially of, or consist of one or both of silicon dioxide and silicon nitride.

The wordlines 13 and 14 may be formed to any suitable thickness within the shallow trenches 65 and 67. In some embodiments, the wordlines and the gate dielectric material 72 together fill less than 80% of the overall depths of the shallow trenches.

The source/drain regions 78/80 may be considered to be paired source/drain regions associated with individual transistors. In the shown embodiment, one of the paired source/drain regions (specifically, source/drain region 78) is electrically coupled with a bitline (the bitlines 16 and 17 are diagrammatically illustrated in FIG. 2) and the other of the paired source/drain regions (specifically, source/drain region 80) is electrically coupled with a charge storage device (capacitors 42 are diagrammatically illustrated in FIG. 2 as example charge storage devices). In some embodiments, the bitlines may be electrically coupled to drain regions, and the charge storage devices may be electrically coupled to source regions.

The source/drain regions 78/80 of FIG. 2 correspond to the first and second sides of the cell active material structures 20-31 of FIG. 1. For instance, source/drain regions 78 and 80 of transistor 82 correspond to first and second sides 34 and 36 of the cell active material structure 21; and source/drain regions 78 and 80 of transistor 84 correspond to first and second sides 38 and 40 of cell active material structure 26.

The configuration of FIG. 2 has wordlines 13 and 14 extending along a first direction (specifically, in and out of the page relative to the cross-section of FIG. 2) and has bitlines extending along a second direction which intersects the first direction (with the illustrated bitlines 16 and 17 extending horizontally along the plane of the cross-section of FIG. 2).

Memory cells within the configuration of FIG. 2 may be considered to comprise a transistor coupled with a charge storage device. Thus, transistor 82 and the associated charge storage device 42 coupled therewith may be considered to correspond to a first memory cell 90, and the transistor 84 together with the charge storage device 42 coupled therewith may be considered to correspond to a second memory cell 92. The wordlines 13 and 14 pass through the memory cells 90 and 92, respectively. In the shown embodiment, the memory cells 90 and 92 are directly adjacent one another, and separated from one another only by an intervening deep trench 66 filled with electrically insulative material 70. The adjacent memory cells 90 and 92 each have a unique bitline connection.

As can be understood, a DRAM array such as that illustrated with reference to FIG. 2 presents certain scaling challenges that limit increases in data density. The DRAM disturb mechanisms that are becoming of serious concern are transistor leakage and Row Hammer. To understand these mechanisms, the layout and transistor structure of advanced DRAM need to be understood. As shown in FIG. 2 and as described above, it can be seen that the memory system 42 that each memory cell includes a bitline (16, 17) connected to heavily doped diffusion regions 78 located in the substrate 62. In addition, the storage capacitors 42 are connected to the heavily doped diffusion regions 80. Diffusion regions 78, 80 act as the source and drain of a field effect device whose gate 74 and gate dielectric 72 are recessed into the substrate. The gate 74 is part of the wordline of the DRAM. This field effect transistor (usually NMOS) is a very special device made for DRAM that has to have good current drive (e.g. greater than 10 uA) and low leakage.

If a transistor 102 (FIG. 1) leaks while in the off state, it will discharge its associated capacitor 104 if the capacitor is held at a positive potential. Therefore, leakage of such recessed channel transistors has to be in the femtoAmp regime. A major source of transistor leakage is the high electric field at the gate overlapped source/drain region of the transistor.

In the case of Row Hammer, electrons are injected from a cell whose gate is toggled in such a way as to turn the cell transistor on and off many times. These electrons migrate in the local substrate and can be picked up by storage nodes that are connected to capacitors that are at a positive potential. Over time, this cumulative effect can be such that the voltage on these storage nodes droop and can no longer be sensed as they should be. In other words, "hammering" a wordline row can corrupt data in adjacent non-accessed rows. The key to this insidious failure mode is that enough electrons get cumulatively picked up by a nearby cell on a different wordline to cause corruption of data before a DRAM refresh is made. Row Hammer has become a major threat to data integrity in advanced DRAM systems, because the distance between cells is small enough for migrating electrons to reach and the storage capacitance has reduced with scaling.

A similar device physics challenge arises in the case of DRAM's susceptibility to soft errors induced by radiation. In this case, neutrons or alpha particles create electron-hole pairs in the vicinity of critical junctions. If the capacitance of these nodes is small enough and the collected charge large enough, internal circuit voltages can be changed. In a DRAM system, the storage node diffusion is connected to a capacitor of between 10 and 20 fF. This capacitance has been decreasing as DRAM has scaled to higher densities. Since the storage node diffusion is in the substrate where most of the electron-hole pairs are formed, it is susceptible to charge pick up. In this way, DRAM data can be corrupted through soft errors.

There remains, therefore, a need for a DRAM cell structure that overcome these challenges in order to further scale DRAM to higher data density while maintaining data integrity. Embodiments of the present invention such as described herein below overcome these challenges by: (1) replacing the prior art DRAM select transistor with a vertical channel transistor wherein the channel has been formed through selective epitaxy; (2) moving the storage node contact to directly above the wordline; and (3) connecting the bitline by way of a contact to a high diffusion region in the substrate that extends to a location directly under the select transistor's channel. In this way the following advantages are achieved: (1) cell area reduction, since both the select transistor and storage node contact are within/above the wordline; (2) Immunity from Row Hammer, since the storage node is no longer in the substrate and is shielded from the substrate by way of a heavily doped diffusion region that is itself connected to the bitline; (3) bitline toggling between pre-charge, sense and back to pre-charge completely removes any picked up charge and provides electrical shielding of the storage node; (4) Immunity or at last mitigation to radiation-induced soft errors since the storage node is electrically shielded from any electron-hole pairs formed in the substrate through particle irradiation; and (5) improved refresh characteristics due to better independent electric field optimization at the storage node diffusion end of the transistor.

Figure 3:
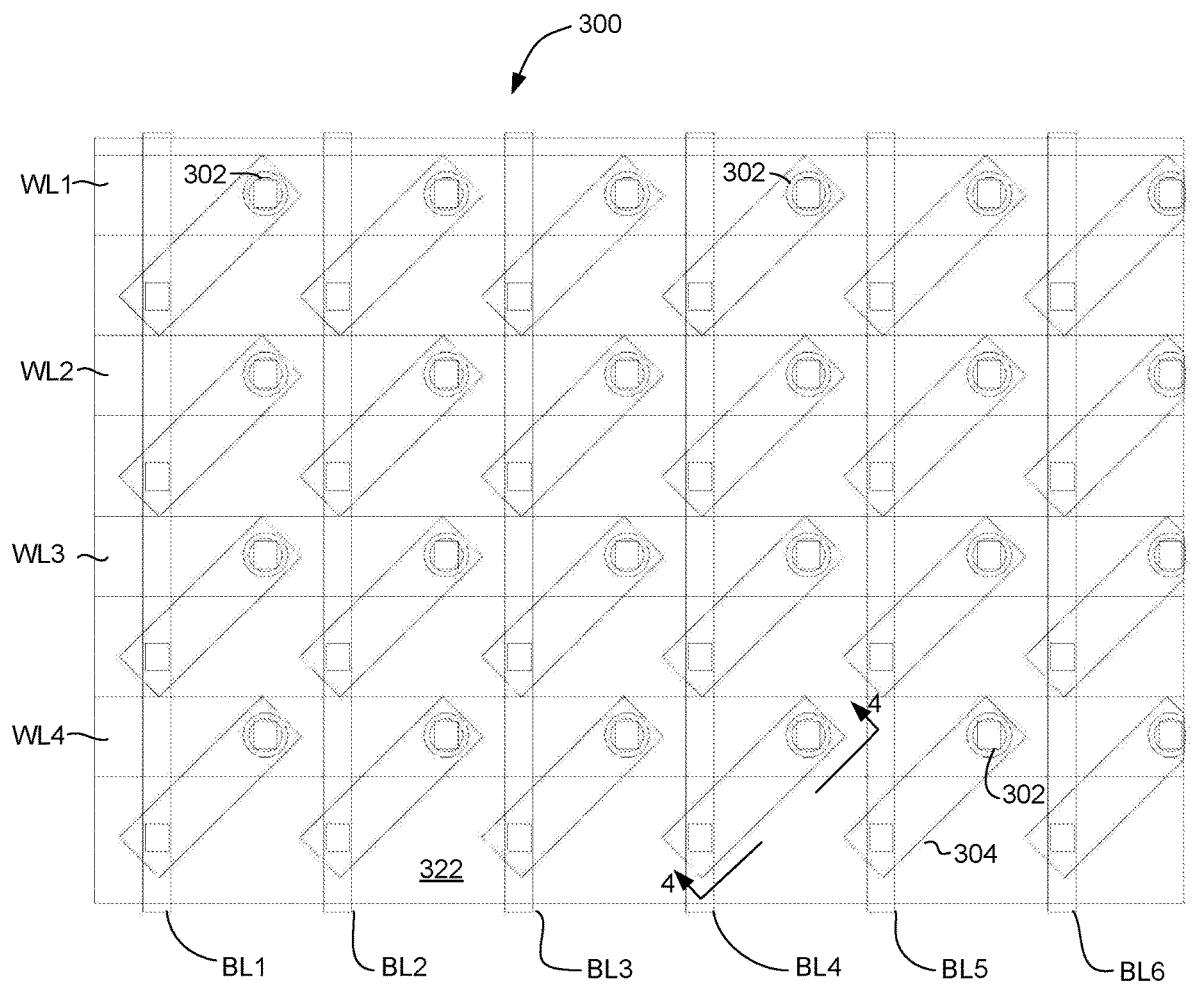
FIG. 3 is a top down view of a DRAM array according to an embodiment.
Figure 4:
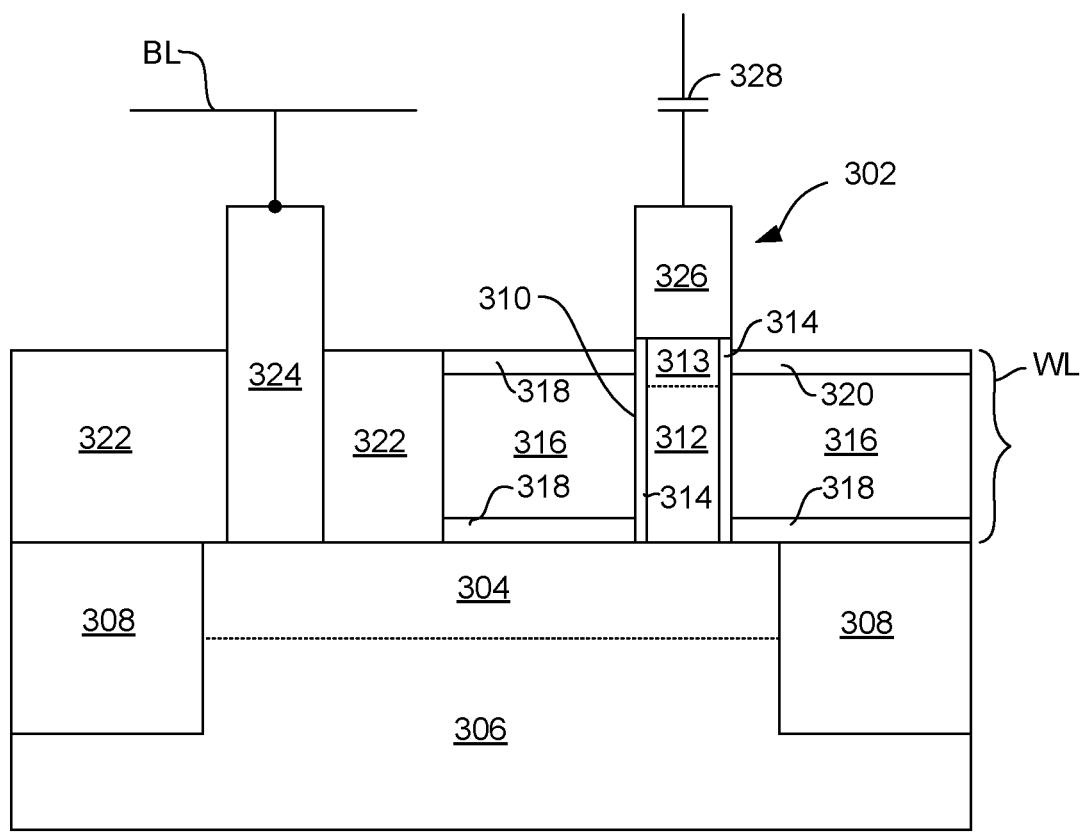
FIG. 4 is a cross-sectional view of a portion of the DRAM array of FIG. 3, as seen from line 4-4 of FIG. 3.

FIGS. 3 and 4 illustrate an embodiment of a DRAM array that can overcome the challenges presented above to allow for high density scaling of DRAM memory. FIG. 3 is a top down view of a DRAM array 300 and FIG. 4 is a cross sectional view of a portion of the array of FIG. 3 as seen from line 4-4 of FIG. 3. As seen in FIG. 3, the array 300 includes a plurality of wordlines WL and a plurality of bitlines BL that can be generally orthogonal to the word lines WL. Each wordline WL1-WL4 is connected with a row of memory cell structures 302 and each bitline BL1-BL2 is connected with a column of the memory cell structures 302. Connection between each bitline BL and an associated memory cell structure 302 can be made via a highly doped diffusion region 304 formed within the substrate as will be seen. As shown in FIG. 3, the highly doped diffusion regions 304 can be arranged generally diagonal relative to the wordlines and bitlines WL, BL. The highly doped diffusion regions 304 as shown in FIG. 3 can be buried beneath other structures (as seen in FIG. 4), but are shown in FIG. 3 in order to understand this diagonal orientation of the highly doped diffusion region 304 relative to the wordlines WL and bitlines BL.

With reference now to FIG. 4, which shows a cross-section taken from line 4-4 of FIG. 3, the memory cell structure 302 is formed on a semiconductor substrate 306. The semiconductor substrate 306 can be a monocrystalline Si substrate, or could be some other suitable semiconductor material such as silicon-on-insulator. Isolation material 308 is buried into the substrate 306 and is formed to surround the highly doped regions 304. The isolation layer can be an oxide or nitride, such as silicon oxide or silicon nitride.

A vertical transistor structure 310 is formed directly on the surface of the substrate 306. More specifically, the vertical transistor structure 310 is formed directly on the highly doped diffusion region 304 of the semiconductor substrate 306. The vertical transistor structure 310 includes a semiconductor pillar 312 that is surrounded at its outer side by a thin gate dielectric layer 314. The semiconductor pillar 312 is preferably an epitaxial semiconductor, and more preferably is a mono-crystalline or nearly monocrystalline semiconductor such as silicon or silicon-germanium that is formed on an etched, crystalline surface of the highly doped diffusion region 304 of the semiconductor substrate 312 by selective epitaxial growth. Such selective epitaxial growth, which will be described herein below in greater detail allows the semiconductor column to be formed with a monocrystalline or nearly mono-crystalline structure. For example, the semiconductor pillar can have a structure that is at least 80 percent monocrystalline by volume or more preferably at least 90 percent monocrystalline by volume. Such a structure allows for a field effect transistor that has high drive current when on, low leakage when off, and sharp turn-on all of which are required for such memory applications. The semiconductor column can have a cylindrical shape, but could have another shape, such as but not limited to a rectangular prism or other type of polygonal prism. An upper portion 313 of the semiconductor pillar 312 can be doped, such as with phosphorus, arsenic or antimony to form a drain region of the transistor structure 310. The lower heavily doped diffusion layer 304 at the opposite end can provide a source region for the transistor structure 310. The surrounding gate dielectric 314 can be a thin oxide or nitride, such as silicon oxide or silicon nitride or a combination thereof. Alternatively, some high-k dielectric may be used either alone or in combination with the afore-mentioned materials. An example here would be an oxide of hafnium or aluminum.

The wordline WL structure extends to surround the sides of the vertical transistor 310 which can be seen with reference to both FIGS. 3 and 4. The wordline structure WL includes an electrically conductive gate layer 316, and upper and lower dielectric layers 318, 320 arranged at the top and bottom of the electrically conductive gate layer 316. The electrically conductive gate layer 316 is arranged to contact the gate dielectric layer 314, such that the gate dielectric layer 314 separates the electrically conductive gate layer 316 from the semiconductor pillar structure.

Areas outside of the wordline structure WL can be filled with a dielectric material 322 which can be an oxide or nitride such as silicon oxide or silicon nitride. A bitline contact structure 324 can be electrically connected with the highly doped diffusion region 304 and also with bitline circuitry BL. The contact structure 324 can be an electrically conductive material such as W, Cu, Co, Ta, Ti, TiN etc. In this way, the contact structure 324 can provide electrical connection between the source end of the transistor structure 310 and the bitline circuitry BL. This allows the source region of the vertical transistor 310 to be connected to the highly doped region 304 which in turn is connected to a relatively high capacitance node, the BL, which is itself switched between operations of reading the data in the memory cell. This approach allows the storage node capacitor 328 to be electrically isolated from the substrate.

The upper end (e.g. source region) of the semiconductor pillar 312 can be electrically connected with an electrically conductive contact 326, which can provide electrical connection between the semiconductor pillar 312 of the transistor structure and a memory element 328. In one embodiment, the memory element 328 can be a capacitor capable of storing a charge indicating a memory state. The opposite side of the capacitor 328 is connected to a potential called the plate which can be held at either ground or a constant positive potential.

Figure 5:
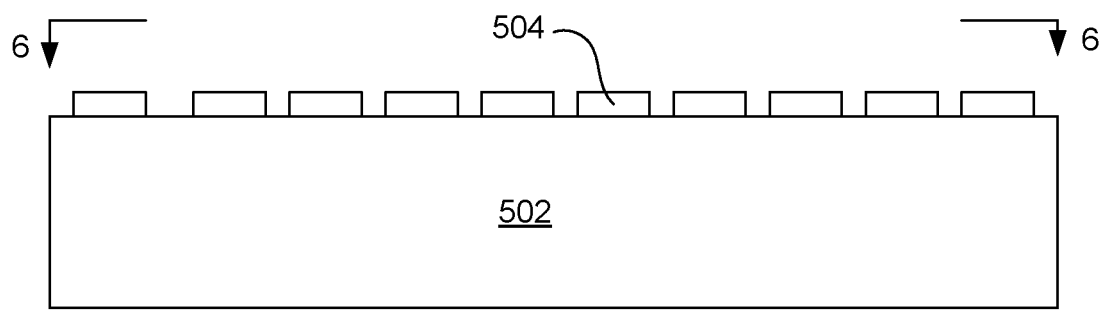
FIGS. 5-18 are views of a DRAM array in various intermediate stages of manufacture illustrating a method of manufacturing a DRAM array according to an embodiment.
Figure 6:
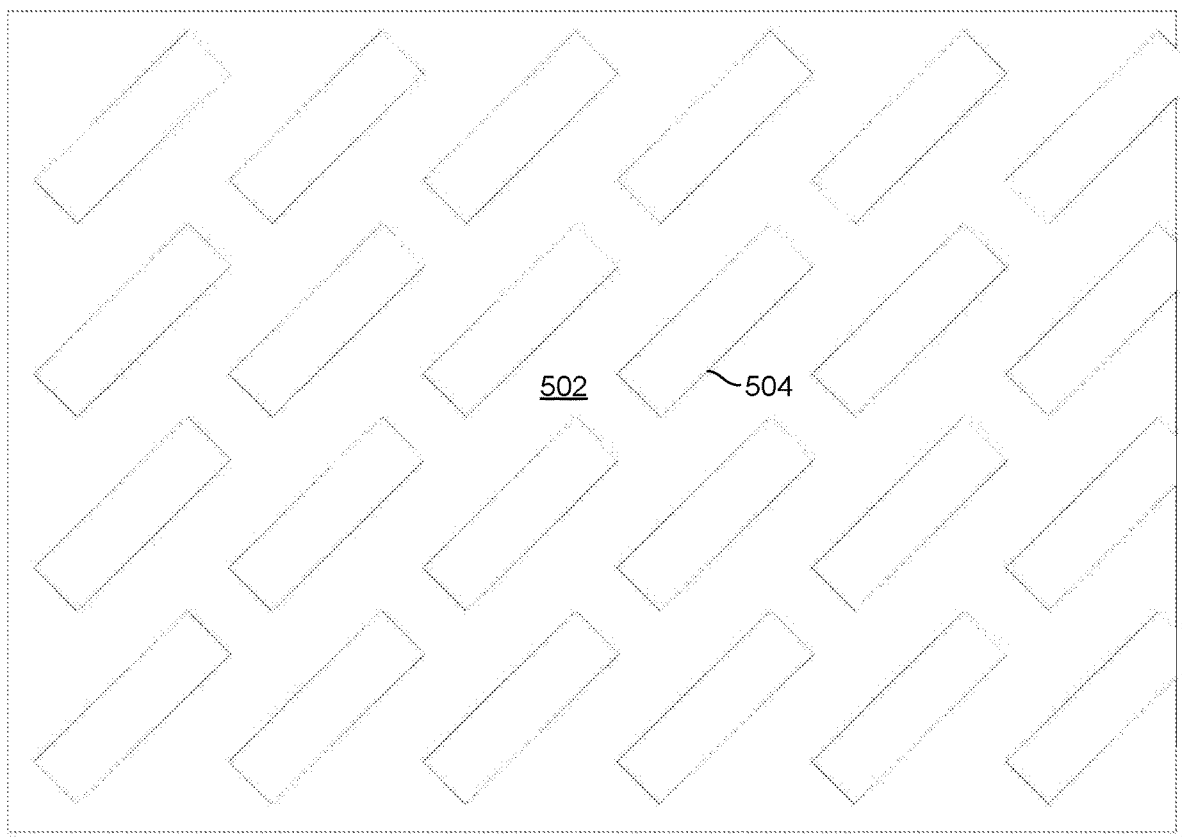

FIGS. 5-18 show a portion of a magnetic memory array in various intermediate stages of manufacture in order to illustrate a method for manufacturing a DRAM memory array according to an embodiment, which could be used to form a structure such as that described above with reference to FIGS. 3 and 4. With reference to FIG. 5, a semiconductor substrate 502 is provided, which can be a monocrystalline silicon substrate or could be silicon-on-insulator. A mask structure 504 is formed over the semiconductor substrate 502. FIG. 6 shows a top down view as seen from line 6-6 of FIG. 5. As can be seen in FIG. 6, the mask 504 is configured to cover areas of the substrate 502 where a highly doped diffusion area will be formed.

Figure 7:
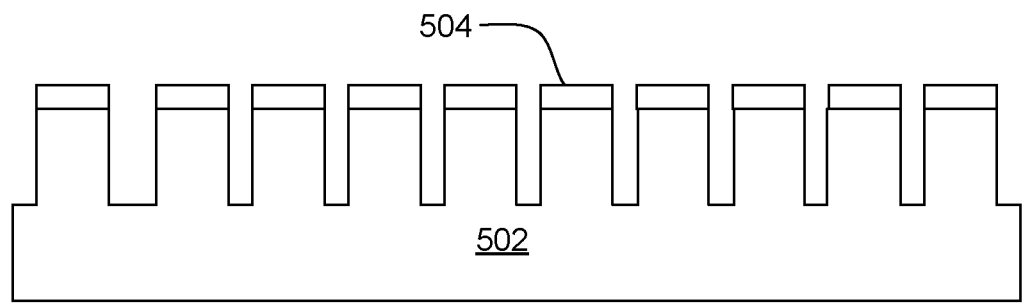

With reference now to FIG. 7, an etching process is performed to remove portions of the substrate 502 that are not protected by the mask 504, thereby leaving trenches surrounding the masked area. These trenches can then be filled with an insulating fill material 802 such as an oxide or nitride (i.e. silicon oxide or silicon nitride) and a chemical mechanical polishing process can be performed to planarize the structure, resulting in a structure shown in cross-section in FIGS. 8 and 9.

Figure 8:
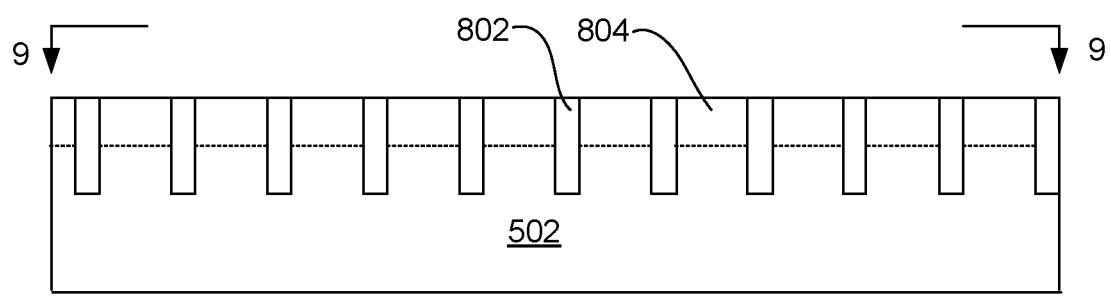
Figure 9:
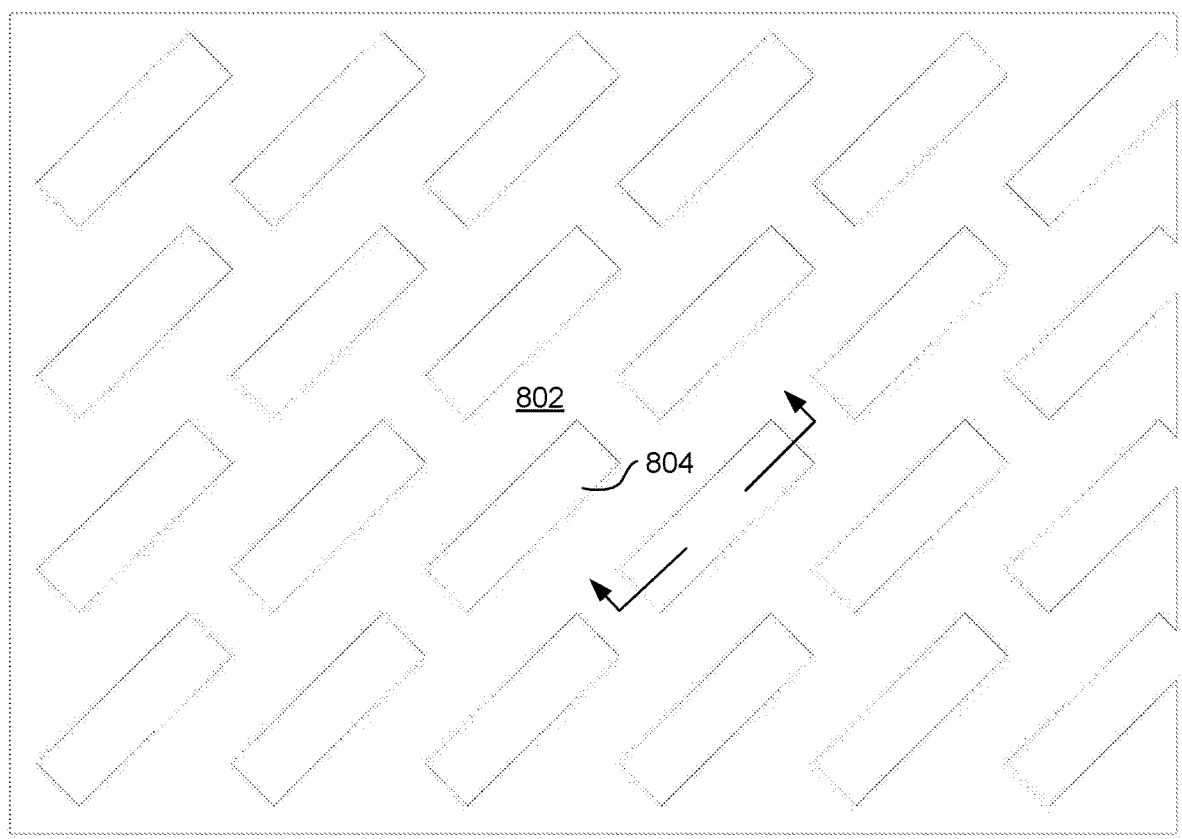

The exposed portion of the semiconductor substrate can be doped such as by ion implantation such that the upper portion of the exposed portions of the substrate form highly doped diffusion regions 804 of the substrate 502, the highly doped diffusion regions 804 being surrounded at their outer sides by the dielectric isolation layers 802 as seen in FIG. 9. As can be seen in FIG. 8, the dielectric isolation material 802 extends significantly beneath the highly doped diffusion regions 804. The dopant used for regions 804 can be arsenic, phosphorus or antimony and can be introduced through ion implantation.

Figure 10:
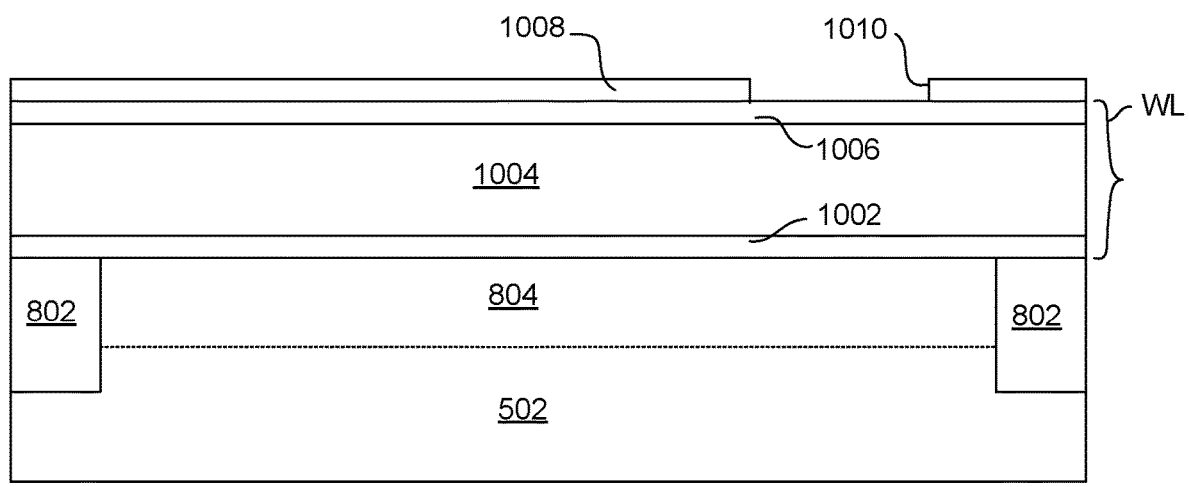

With reference now to FIG. 10, word line layers WL are deposited full film over the isolation layer 802 and highly doped diffusion layers 804. The word line layers WL can include a first dielectric layer 1002, an electrically conductive gate material 1004 and a second dielectric layer 1006, arranged such that the electrically conductive gate material 1004 is located between the first and second dielectric layers 1002, 1006. The first and second dielectric layers 1002, 1006 can be an oxide or nitride, such as silicon oxide or silicon nitride. The electrically conductive gate material 1004 can be an electrically conductive metal such as Ta, TiN or W or could be a polycrystalline silicon that is doped either n-type or p-type. N-type dopants can be phosphorus, arsenic or antimony and p-type can be boron or gallium.

Figure 11:
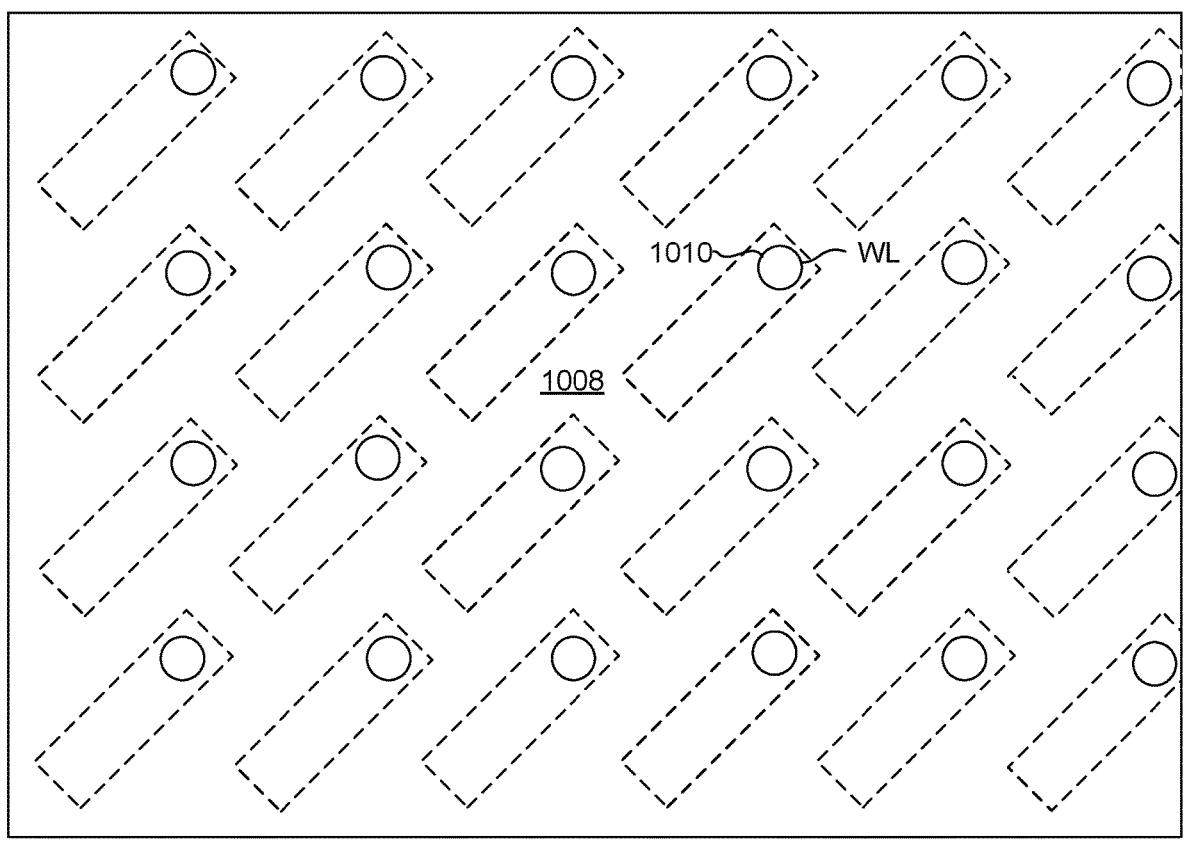

With continued reference to FIG. 10, a mask structure 1008 is formed over the wordline layers WL. The mask structure 1008 is provided with openings 1010 that are configured to define a vertical transistor structure as will be seen. FIG. 11 shows a top down view illustrating a possible configuration of the mask 1008 and openings 1010, with the openings being arranged over an end of each of the highly doped diffusion regions. In FIG. 11, the highly doped diffusion regions are illustrated in dashed line to indicate that they are beneath the mask 1008. The wordline layers WL are exposed through the openings 1008 as shown in FIG. 11.

Figure 12:
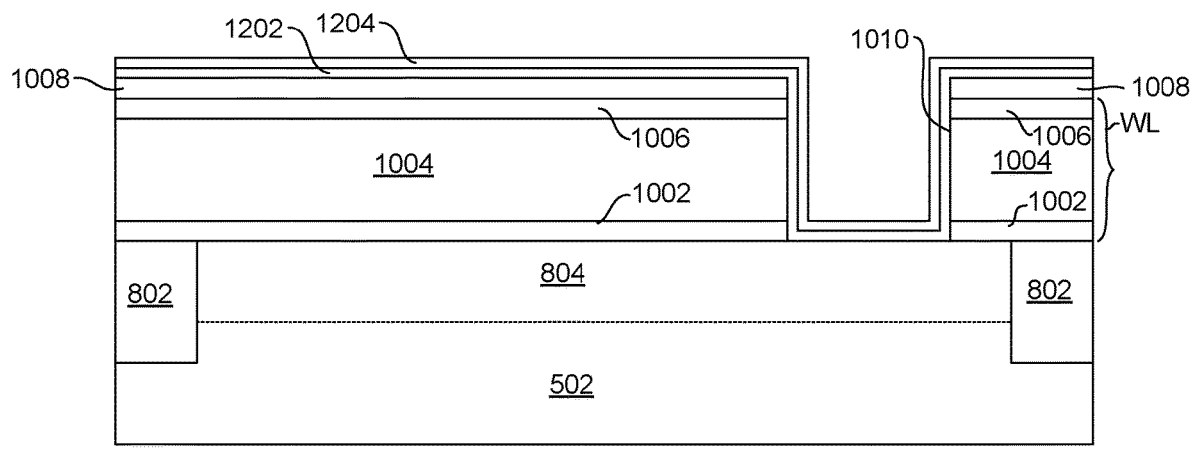

With reference now to FIG. 12, an etching process such as ion milling and or reactive ion etching is performed to remove portions of the wordline layers WL exposed through the openings 1010 in the mask 1008. This etching process is performed until the highly doped diffusion region 804 has been reached. After the etching has been performed sufficiently to reach the underlying highly doped diffusion region, a layer of gate dielectric material 1202 is deposited, followed by a protective layer 1204. The gate dielectric layer can be an oxide or nitride such as silicon oxide or silicon nitride or some form of high-k dielectric containing hafnium or aluminum, and the protective layer can be a material such as amorphous silicon. Both the gate dielectric layer 1202 and the protective layer 1204 can be deposited by a conformal, isotropic deposition process such as chemical vapor deposition, atomic layer deposition, etc.

Figure 13:
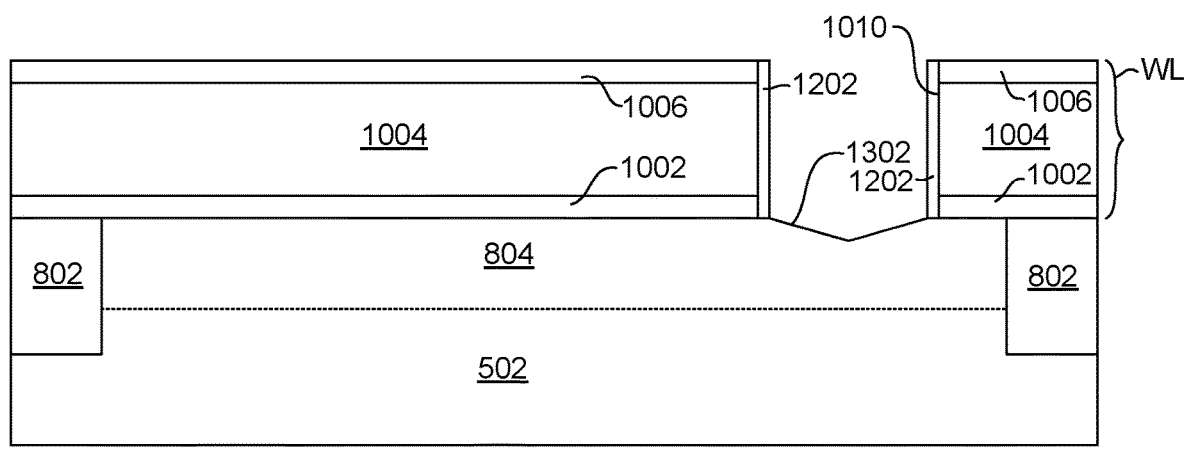

Then, an anisotropic material removal process such as ion milling or reactive ion etching can be used to preferentially remove horizontally disposed portions of the layers 1202, 1204, in order to remove these layers from the bottom of the opening to expose the underlying highly doped diffusion region 804. Another etching process such as reactive ion etching or a high temperature vapor etch with HCl can be performed to remove any remaining protective layer 1204, leaving a structure as seen in FIG. 13 with the gate dielectric layer remaining only on the inner sides of the previously formed openings. The mask structure 1010 (FIG. 12) can also be removed. Further etching can be performed to remove any native oxide from the surface of the highly doped diffusion region, leaving only monocrystalline doped semiconductor material exposed at the opening. As shown in FIG. 13, this etching is preferably performed in such as manner to form a beveled surface 1302 of the highly doped diffusion layer 804. This beveled shaped surface 1302 has been shown to provide good results in growing monocrystalline semiconductors through selective epitaxial growth, as will be seen.

Figure 14:
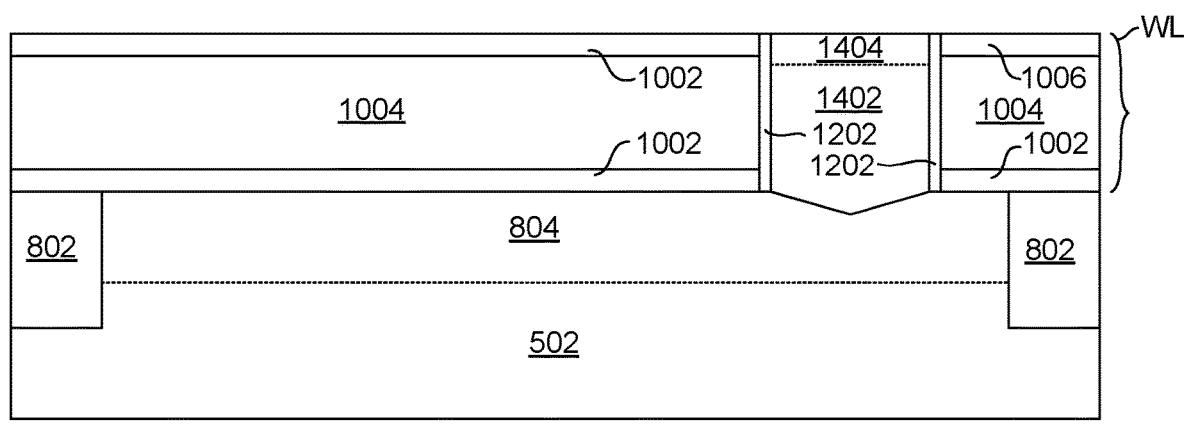

With reference now to FIG. 14, a semiconductor material 1402 can be grown upward from the etched highly doped diffusion region 804. The semiconductor material 1402 is preferably grown by selective epitaxial growth in a reduced pressure chemical vapor deposition furnace, wherein the semiconductor material only grows on the exposed etched underlying semiconductor material 804. This selective epitaxial growth advantageously causes the semiconductor material 1402 to grow with a monocrystalline or nearly monocrystalline structure. For example, the semiconductor material 1402 can be grown by this method to have a structure that is at least 80 percent monocrystalline by volume, or more preferably at least 90 percent monocrystalline by volume. This semiconductor material 1402 is preferably grown to completely fill the opening in the word line layers WL. A chemical mechanical polishing step can be used after epitaxial growth to flatten the top surface of the grown channel. A top portion 1404 of the semiconductor material 1402 can be doped to form a drain region. This upper region 1404 can be doped with, for example arsenic, phosphorus or antimony, which can be achieved in-situ or through ion implantation. After such doping, the top portion 1404 can be silicided by depositing a layer of a metal such as Ti, Co, Ni and reacting it with the exposed top layer and then removing any metal between the exposed top regions on different channel pillars. The semiconductor material 1402 and doped region 1404 along with the gate dielectric 1202 and electrically conductive gate material form a vertical transistor structure. It should be pointed out that, while one such vertical semiconductor pillar structure 1402/1404 is shown in FIG. 14, this is by way of illustration as many rows of such semiconductor pillar structures could be formed by the above described processes.

Figure 15:
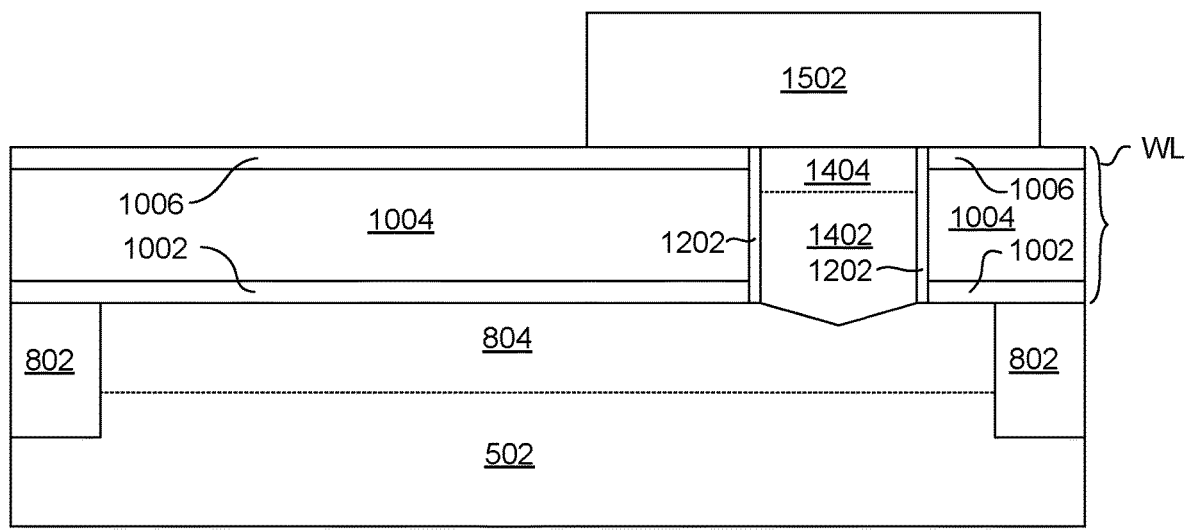
Figure 16:
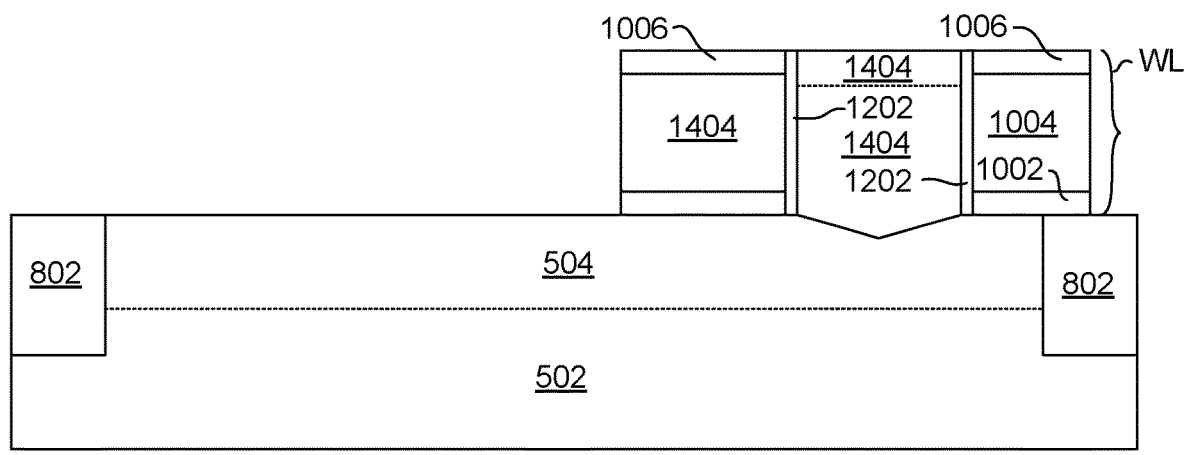
Figure 17:
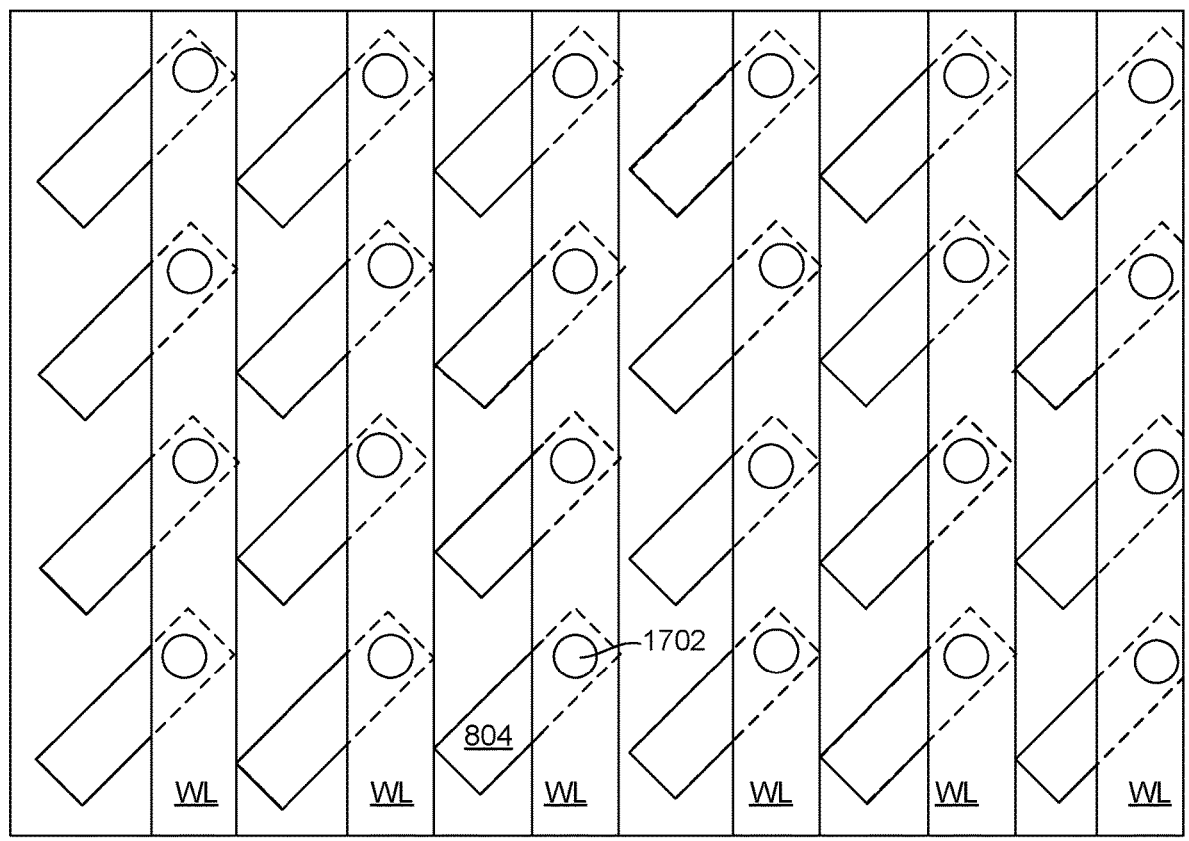

With reference now to FIG. 15, a second mask structure 1502 is formed over the semiconductor pillar structure 1402/1404 and word line layers WL. The mask is configured to define a series of parallel word lines, and is formed to cover areas where the word line layers WL are desired to form individual word line structures, as will be seen. After the mask 1502 has been formed, an etching process such as reactive ion etching and/or ion milling is performed to remove portions of the wordline layers WL that are not protected by the mask 1502. The mask can then be removed, leaving a structure as seen in FIG. 16. In this manner, a plurality of generally parallel individual wordlines WL can be formed over rows of transistor structures, which can be seen more clearly with reference to FIG. 17, which shows a top down view of a plurality of wordline structures WL formed over rows of transistor structures 1702. Each of the vertical transistor structures 1702 include the previously formed semiconductor column 1402/1404 and surrounding gate dielectric 1202. As can be seen, the highly doped diffusion regions 804 extend beyond the edges of the individual word line structures WL and in some embodiments can be formed at a diagonal relative to the individual wordline structures WL.

Figure 18:
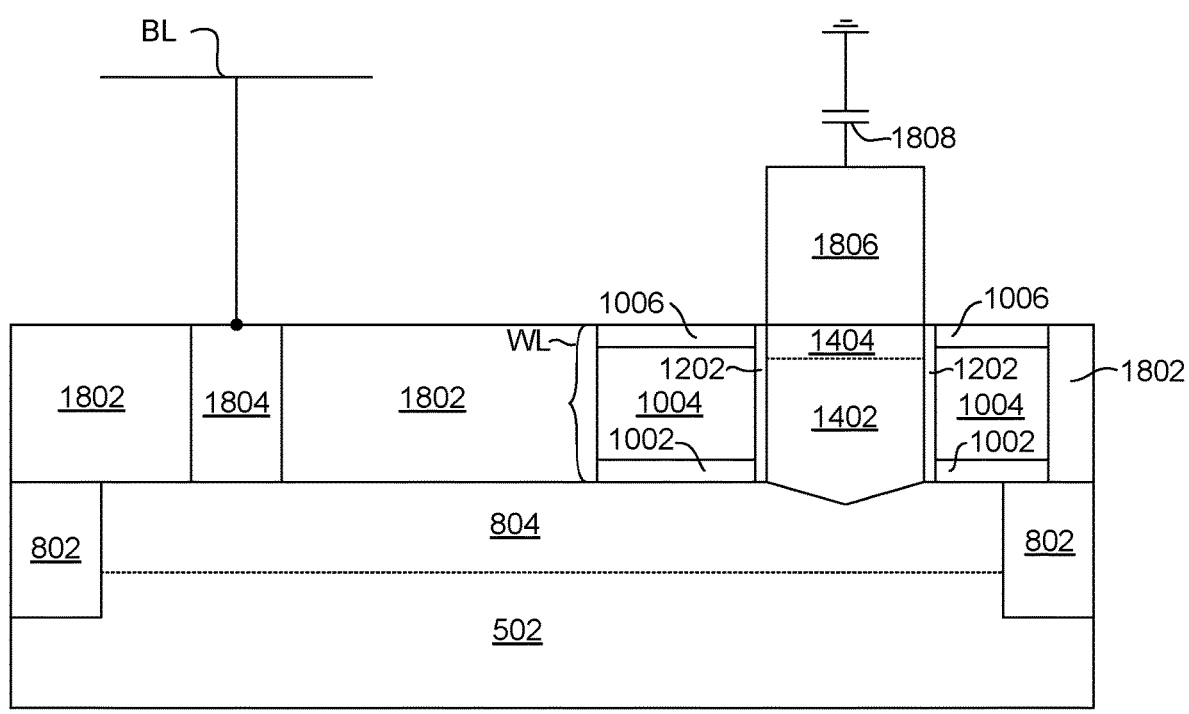

With reference now to FIG. 18, a dielectric fill layer 1802 can be deposited to fill the areas between the wordline structures WL, and a chemical mechanical polishing process can be performed to planarize the surface. The dielectric fill layer can be an oxide or nitride material such as silicon oxide or silicon nitride. A masking and etching process can be performed to form an opening in the dielectric fill material 1802 that extends to the highly doped diffusion region 804. An electrically conductive contact 1804 can be formed within the opening. The electrically conductive contact can be formed to provide electrical contact between the highly doped diffusion layer 804 and bitline circuitry BL. In addition, an electrical contact 1806 can be formed over and electrically connected with the semiconductor pillar structure 1402/1404. The contact 1806 can be electrically connected with a memory element 1808, which in some embodiments can be a capacitor, as shown.

The above described DRAM structure provides many significant advantages over previous DRAM systems, which allows for greatly increased scaling and improved performance. The use of the vertical DRAM cell transistor with a selective epitaxially grown channel provides benefits in cost, immunity from Row Hammer disturb, improvements in radiation hardness and better, lower power refresh. The unique device physics for these advantages are given below. Previously employed DRAM cells have required: two contacts to diffusions located in the substrate silicon; a bitline; a wordline; a selector transistor with U-shaped ("saddle-fin") lateral channel; and field isolation. A DRAM system such as described above includes advantageous structure features including: one contact to the diffusion layer, located in the substrate silicon; one contact located on top of the word line; a bitline; select transistor with vertical channel; and field isolation. Removing a contact from the substrate and effectively placing it on top of the wordline leads to a more compact cell layout. Some widening of the word line is desired to make sure that the vertical transistor channel does not increase the word line resistance, but this is offset by the space savings of the contact move.

A DRAM of the prior art has the storage node connected to heavily doped regions (usually N+) in the substrate. With such a construction, every time a particular wordline is switched to read the contents of a row, the wordline is switched from low potential to positive potential and back to low potential. This turns all of the cell transistors on and then off all along this wordline. As such, a disturb mechanism that has been referred to as Row Hammer results. In this disturb mechanism, a particular storage node at ground (aggressor node) can affect another nearby cell at positive potential on a different word line (victim node). It has been found that in many cases, a repetitive read on the word line attached to a grounded storage node will corrupt the data in a nearby storage node initially at positive potential and on a different wordline.

The model for this is electron injection into the substrate from the switching aggressor wordline transistor connected to the grounded storage node. Electron injection into the substrate from an NMOS inversion layer has been used in the past in high voltage silicon devices, but in advanced DRAM, the ever-shrinking dimensions and the lowering of the storage node capacitances have resulted in this Row Hammer disturb mode arising. If a victim storage node's potential can be lowered enough before a refresh can restore it to a safe state, DRAM data corruption can take place. Row Hammer is the most important DRAM disturb mode and is causing hackers to corrupt precious data in sensitive systems.

The embodiments described above completely eliminate Row Hammer in several ways. First, the storage node diffusion is no longer in the substrate. In addition, the storage node is shielded from charge in the substrate by a heavily doped diffusion region. This heavily doped diffusion region is connected to a much larger capacitance (i.e. the bitline). The bitline capacitance, at 100 fF to 150 fF is usually 5 to 10 times the capacitance of the storage node. This heavily doped diffusion is bitline switched every time between consecutive row reads/writes so that any electrons picked up by the heavily doped diffusion will be swept away in a very efficient manner. As such, there will be no cumulative charge pickup at any storage node.

The heavily doped diffusion acts in a similar manner to diffusion guard-rings placed around noisy circuitry such as I/Os. The main difference is that in the above embodiments the heavily doped diffusion will be far more efficient in charge pickup. In fact, no electrons should get through to any storage node. This is in contrast with previous recent DRAM systems that involve the placement of energy barriers to electron transport between the aggressor cell and the victim storage node. In the above described embodiments, the aggressor cell is connected to a grounded storage node while the victim cell is connected to a storage node at positive potential. The shielding aspect of the heavily doped diffusion regions is clear along with their connection to the switching high capacitance bitlines. In such a configuration the cross-sections are made through each vertical transistor, but the word line on each side of any single transistor is continuous.

In addition, previously employed DRAM systems are susceptible to electron-hole pair formations in the substrate due to impinging particles such as alpha and neutrons. The reasons for this are similar to Row Hammer susceptibility, in that the low capacitance storage node diffusions are located in the substrate and their capacitances are decreasing with DRAM scaling. The embodiments described above, however, exhibit advantageous radiation hardness. The heavily doped diffusion regions connected to high capacitance switching bitlines result in ideal electrical shielding from any migrating charge in the substrate.

In addition, the embodiments described above allow for longer times between refresh. A major reason for short refresh times in DRAM is transistor leakage caused by Gate Induced Drain Leakage (GIDL). The main parameters affecting GIDL are gate-to-drain overlap field which is exacerbated by thin gate dielectrics, high drain doping at the gate-to-drain overlap region and defects at the gate dielectric to silicon interface.

The vertical transistor of the above embodiments allows the doping density and its gradient with channel to drain direction to be engineered and optimized for GIDL without impacting cell area. This is because this direction is orthogonal to the plane of the substrate. In the above described embodiments drain dopant level and gradient can be engineered in the vertical direction to minimize GIDL and therefore, extend DRAM refresh times. Techniques used can be in-situ doping with gradient in doping density as the channel is selectively epitaxially grown. Also, implantation and annealing can be used to tailor the doping density and gradient.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A dynamic random access memory device, comprising:
   a semiconductor substrate having a doped diffusion region formed therein;
   a vertical transistor structure formed on a surface of the doped diffusion region of the semiconductor substrate, the transistor structure including a semiconductor pillar and a gate dielectric layer formed at a side of the semiconductor pillar;
   a wordline including an electrically conductive gate layer contacting the gate dielectric layer;
   a bit line, separated from the doped diffusion region and electrically connected with the doped diffusion region of the semiconductor substrate through a bit line contact structure, wherein the bit line contact is aligned in a direction perpendicular to the semiconductor substrate; and
   a memory element electrically connected with an end of the semiconductor pillar.

2. The dynamic random access memory device as in claim 1, wherein the memory element is a capacitor.

3. The dynamic random access memory device as in claim 1, wherein the bit line is electrically connected with a first end of the semiconductor pillar via the doped diffusion region and the memory element is electrically connected with a second end of the semiconductor pillar structure that is opposite the first end.

4. The dynamic random access memory device as in claim 1, wherein the semiconductor pillar comprises an epitaxially grown semiconductor.

5. The dynamic random access memory device as in claim 1, wherein the semiconductor pillar comprises epitaxially grown Si.

6. The dynamic random access memory device as in claim 1, wherein the memory element is located above the surface of the semiconductor substrate such that the vertical transistor structure is between the memory element and the semiconductor substrate.

7. The dynamic random access memory device as in claim 1, wherein the electrically conductive gate layer surrounds an outer side of the gate dielectric layer.

8. The dynamic random access memory device as in claim 1, wherein the wordline further comprises first and second dielectric layers arranged such that the electrically conductive gate layer is located between the first and second dielectric layers.

9. The dynamic random access memory device as in claim 1, wherein the semiconductor pillar has an end located opposite the semiconductor substrate that is doped to form a drain region.

10. The dynamic random access memory device as in claim 1, wherein the semiconductor pillar is substantially monocrystalline.

11. The dynamic random access memory device as in claim 1, wherein the semiconductor pillar is at least 80 percent monocrystalline by volume.

12. The dynamic random access memory device as in claim 1, wherein the semiconductor pillar is at least 90 percent monocrystalline by volume.

13. The dynamic random access memory device as in claim 1, wherein the semiconductor pillar comprises silicon.

14. The dynamic random access memory device as in claim 1, wherein the semiconductor pillar comprises silicon-germanium.

15. The dynamic random access memory device as in claim 1, wherein the semiconductor pillar comprises indium-gallium-arsenide.

* * * * *